(12) United States Patent
Feichtinger et al.

(10) Patent No.: US 10,818,641 B2
(45) Date of Patent: Oct. 27, 2020

(54) MULTI-LED SYSTEM

(71) Applicant: EPCOS AG, Munich (DE)

(72) Inventors: Thomas Feichtinger, Graz (AT); Stephan Steinhauser, Ligist (AT); Günter Pudmich, Köflach (AT); Edmund Payr, Graz (AT); Sebastian Brunner, Graz (AT)

(73) Assignee: EPCOS AG, Munich (DE)

(*) Notice: Subject to any disclaimer, the term of this patent is extended or adjusted under 35 U.S.C. 154(b) by 0 days.

(21) Appl. No.: 16/086,567

(22) PCT Filed: Mar. 21, 2017

(86) PCT No.: PCT/EP2017/056687
§ 371 (c)(1),
(2) Date: Sep. 19, 2018

(87) PCT Pub. No.: WO2017/162665
PCT Pub. Date: Sep. 28, 2017

(65) Prior Publication Data
US 2019/0103384 A1 Apr. 4, 2019

(30) Foreign Application Priority Data
Mar. 24, 2016 (DE) .......... 10 2016 105 578
Apr. 22, 2016 (DE) .......... 10 2016 107 497

(51) Int. Cl.
H01L 23/48 (2006.01)
H01L 25/075 (2006.01)
(Continued)

(52) U.S. Cl.
CPC ........ *H01L 25/0753* (2013.01); *H01L 25/167* (2013.01); *H01L 27/0248* (2013.01);
(Continued)

(58) Field of Classification Search
CPC ............... H01L 25/0753; H01L 25/167; H01L 25/0248; H01L 33/504; H01L 33/486;
(Continued)

(56) References Cited

U.S. PATENT DOCUMENTS 7,768,754 B2  8/2010  Collins, III et al.
8,348,457 B2  1/2013  Kadotani et al.
(Continued)

FOREIGN PATENT DOCUMENTS

CN  101452986 A  6/2009
DE  102012104494 A1  11/2013
(Continued)

OTHER PUBLICATIONS

Liann-Be Chang et al., "Electrostatic Reliability Characteristics of GaN Flip-Chip Power Light-Emitting Diodes with Metal-Oxide-Silicon Submount," IEEE Transactions on Electronic Devices, IEEE, Jan. 2010, vol. 57, No. 1, pp. 119-124.

Primary Examiner — Hoa B Trinh
(74) Attorney, Agent, or Firm — Slater Matsil, LLP

(57) ABSTRACT

A multi-LED system is disclosed. In an embodiment a multi-LED system includes a ceramic multilayer substrate in which at least two ESD protection structures are integrated, at least two light-emitting diodes arranged on the substrate and at least two capping layers covering one of the light-emitting diodes.

12 Claims, 3 Drawing Sheets

(51) Int. Cl.
*H01L 25/16* (2006.01)
*H01L 33/48* (2010.01)
*H01L 33/50* (2010.01)
*H01L 27/02* (2006.01)
*H01L 33/64* (2010.01)
*H01L 33/00* (2010.01)

(52) U.S. Cl.
CPC .......... *H01L 33/486* (2013.01); *H01L 33/504* (2013.01); *H01L 33/641* (2013.01); *H01L 33/0095* (2013.01)

(58) Field of Classification Search
CPC ... H01L 33/641; H01L 33/0095; H01L 23/48; H01L 23/49
See application file for complete search history.

(56) References Cited

U.S. PATENT DOCUMENTS

| | | | |
|---|---|---|---|
| 9,232,573 B2 | 1/2016 | Miyashita | |
| 9,337,408 B2 | 5/2016 | Feichtinger et al. | |
| 9,449,958 B2 | 9/2016 | Feichtinger et al. | |
| 9,576,939 B2 | 2/2017 | Roth et al. | |
| 9,761,763 B2* | 9/2017 | Steranka | H01L 33/50 |
| 9,865,381 B2 | 1/2018 | Miyauchi et al. | |
| 10,020,292 B2 | 7/2018 | Stoll et al. | |
| 2005/0152146 A1* | 7/2005 | Owen | A61L 2/10 |
| | | | 362/294 |
| 2006/0232373 A1 | 10/2006 | Kanazawa et al. | |
| 2010/0258827 A1* | 10/2010 | Lee | H01L 24/26 |
| | | | 257/98 |
| 2011/0141638 A1 | 6/2011 | Hoshikawa et al. | |
| 2012/0032757 A1* | 2/2012 | Dudesek | H01C 7/18 |
| | | | 333/185 |
| 2012/0146066 A1* | 6/2012 | Tischler | H01L 27/156 |
| | | | 257/89 |
| 2013/0119417 A1 | 5/2013 | Andrews et al. | |
| 2014/0265921 A1 | 9/2014 | Collins | |
| 2015/0243865 A1 | 8/2015 | Feichtinger et al. | |
| 2015/0342027 A1 | 11/2015 | Feichtinger et al. | |
| 2017/0309802 A1 | 10/2017 | Feichtinger et al. | |

FOREIGN PATENT DOCUMENTS

| | | |
|---|---|---|
| DE | 102012113014 A1 | 6/2014 |
| DE | 102013114723 A1 | 6/2014 |
| DE | 102014101092 A1 | 7/2015 |
| DE | 102014112673 A1 | 3/2016 |
| DE | 102014112681 A1 | 3/2016 |
| JP | 2005244220 A | 9/2005 |
| JP | 2008028029 A | 2/2008 |
| JP | 2009532856 A | 9/2009 |
| JP | 2010129583 A | 6/2010 |
| JP | 2011091257 A | 5/2011 |
| JP | 2011147331 A | 7/2011 |
| JP | 2012114120 A | 6/2012 |
| JP | 2015084374 A | 4/2015 |
| JP | 2015517740 A | 6/2015 |
| JP | 2015526908 A | 9/2015 |
| JP | 2016000831 A | 1/2016 |
| JP | 2006303107 A | 11/2016 |
| WO | 2006035626 A1 | 4/2006 |
| WO | 2009075530 A2 | 6/2009 |
| WO | 2014032859 A1 | 3/2014 |

* cited by examiner

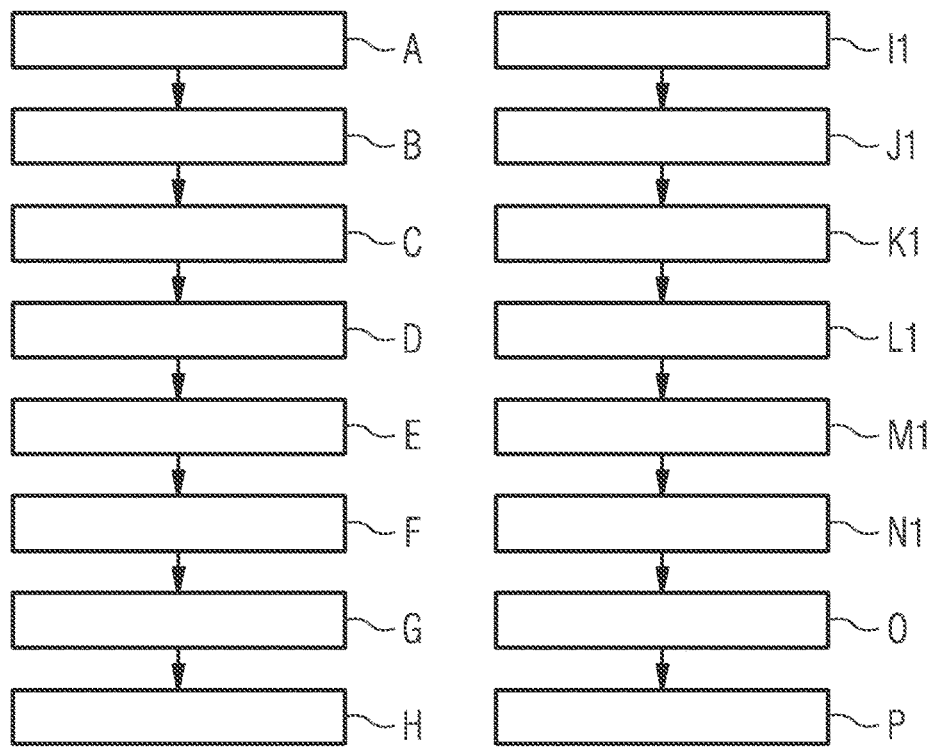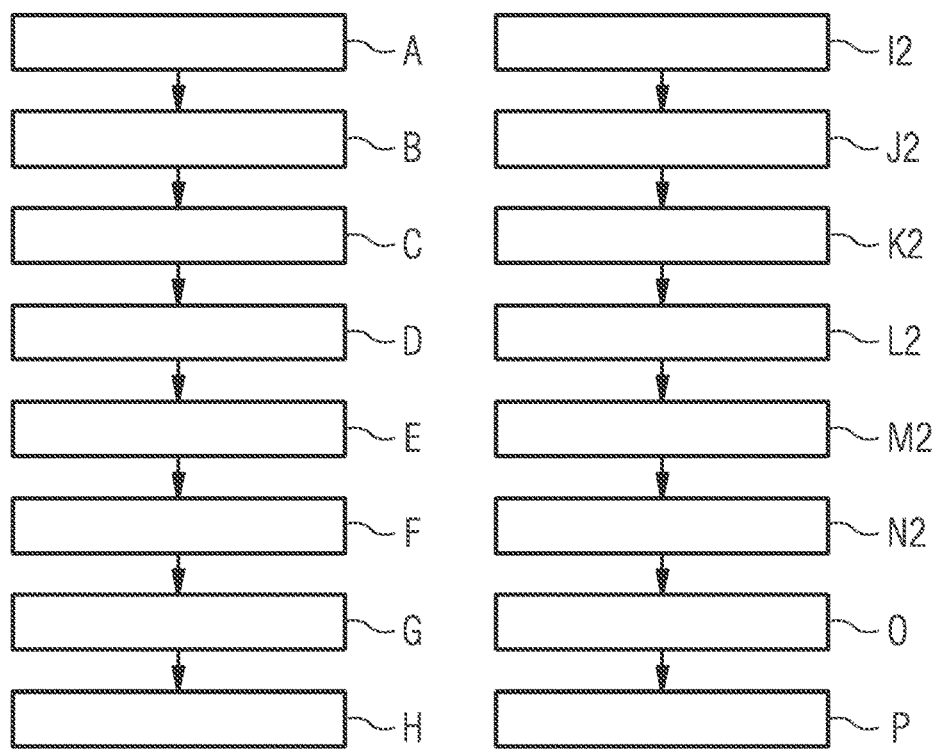

MULTI-LED SYSTEM

This patent application is a national phase filing under section 371 of PCT/EP2017/056687, filed Mar. 21, 2017, which claims the priority of German patent application 10 2016 105 578.6, filed Mar. 24, 2016 and German patent application 10 2016 107 497.7, filed Apr. 22, 2016, each of which is incorporated herein by reference in its entirety.

TECHNICAL FIELD

The present invention relates to a multi-LED system that is embodied, in particular, to produce a flash. Such multi-LED systems are required, in particular, for mobile applications such as smartphones or digital cameras.

BACKGROUND

Multi-LED systems comprising a hybrid design made of a substrate and an assembly of passive components and two light-emitting diodes (LEDs) are known. The LEDs are covered by light-conversion layers such that, for example, a combination of warm-white light and of cold-white light is produced. This should ensure improved illumination and more natural colors in the case of flash photographs.

For the purposes of protecting the LEDs from electrostatic discharges (ESDs), use can be made of discrete components with a varistor function, although these lead to a larger installation size. The document DE 10 2014 101 092 A1 discloses a chip with a varistor function, on which an LED can be mounted.

SUMMARY OF THE INVENTION

Embodiments provide a multi-LED system with improved properties.

The multi-LED system according to embodiments of the invention has a ceramic multilayer substrate, in which at least two ESD protection structures are integrated. At least two light-emitting diodes are arranged on the substrate. In particular, an integrated ESD protection structure is present for each light-emitting diode. Furthermore, the multi-LED system has at least two capping layers, wherein each capping layer covers one of the light-emitting diodes.

Such a multi-LED system allows integration of a plurality of LEDs, optics and an ESD protection in a very small space. In particular, the multi-LED system can be used as a flashlight module in mobile applications.

By way of example, the capping layers are embodied as protection layers and/or as optically active layers. In particular, the capping layers can be embodied to produce different characteristics of the emitted light. Here, these can be light-conversion layers. By way of example, one of the capping layers is embodied to produce warm-white light and another of the capping layers is embodied to produce cold-white light. In addition or as an alternative thereto, the capping layers can also have a lens function.

In one embodiment, no further electrical component is arranged on the substrate in addition to the light-emitting diodes. This facilitates particularly good miniaturization of the multi-LED system.

Alternatively, one or more further electrical components can also be arranged on the substrate, for example, a component for monitoring the temperature. The component can be arranged between the LEDs.

In one embodiment, the multi-LED system has exactly two light-emitting diodes. By way of example, this is a dual LED flash module. In another embodiment, the multi-LED system has a number of n×n light-emitting diodes, where n is an integer greater than 1. By way of example, the light-emitting diodes can be arranged in n rows and n columns. By way of example, the multi-LED system has exactly four light-emitting diodes.

The LEDs can all be arranged in one row. Alternatively, the LEDs can be arranged in a plurality of rows and columns, for example.

First and second external contacts can be arranged on a lower side of the substrate for each light-emitting diode. The external contacts can all be arranged in one row. Alternatively, the external contacts can be arranged in a plurality of rows and columns. As a result, this may result in additional saving of space.

Furthermore, a method for producing such a multi-LED system is specified. According to the method, the substrate with the integrated ESD protection structures is sintered. The light-emitting diodes are attached to an upper side of the sintered substrate in a further method step. Each light-emitting diode is covered by a capping layer. In this way, it is possible to produce, in particular, a multi-substrate that can be diced into a multiplicity of multi-LED systems. In particular, dicing can be implemented after the application of the capping layers.

A plurality of embodiments of the invention are described in the present disclosure. All properties that are disclosed in relation to the multi-LED system and the method are also disclosed accordingly in relation to the other aspects, even if the respective property is not explicitly mentioned in the context of the other aspects.

BRIEF DESCRIPTION OF THE DRAWINGS

The subject matter described here is explained in more detail below on the basis of schematic exemplary embodiments.

In detail:

FIG. 6 shows a flowchart of a method for producing a multi-LED system; and

FIG. 7 shows a flowchart of a further method for producing a multi-LED system.

Preferably, the same reference signs in the following figures refer to functionally or structurally corresponding parts of the various embodiments.

DETAILED DESCRIPTION OF ILLUSTRATIVE EMBODIMENTS

Figure 1:
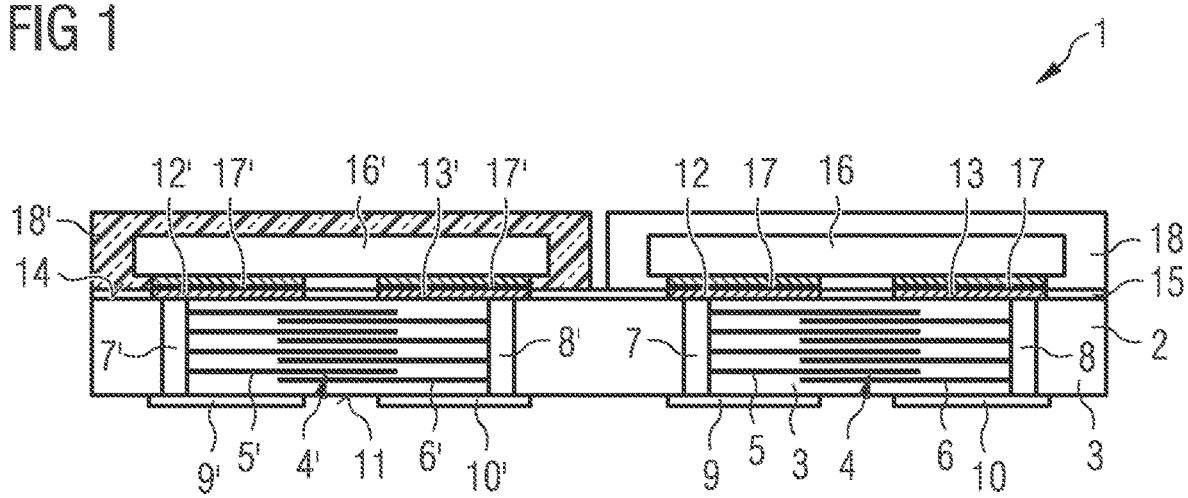
FIG. 1 shows a schematic cross section of an embodiment of a multi-LED system.

FIG. 1 shows a multi-LED system 1 comprising a substrate 2, which is constructed as a multi-layer construct. The substrate 2 has a multiplicity of ceramic layers 3 that are stacked one above the other. Two ESD protection structures 4, 4' are integrated into the substrate 2. The ESD protection structures can also be referred to as ESD protection components. The ceramic is a varistor ceramic, in particular, for example, doped ZnO, SrTiO$_2$ or SiC. By way of example, the doping substances comprise antimony, bismuth and/or praseodymium.

The varistor ceramic has a high thermal conductivity, for example, greater than or equal to 20 W/mK. In particular, the thermal conductivity can be 22 W/mK. In this way, produced heat losses can be dissipated through the varistor ceramic. By way of example, the substrate has a thickness in the range from 200 µm to 500 µm, with this being the thickness of the ceramic without metallizations on the lower and upper side 11, 12.

The ESD protection structures 4, 4' are each constructed from the ceramic layers 3, in particular from portions of the ceramic layers 3, and first electrode layers 5, 5' and second electrode layers 6, 6' arranged therebetween. The first electrode layers 5, 5' are embodied as meshing with the second electrode layers 6, 6'. By way of example, the electrode layers 5, 5', 6, 6' are formed from 100% Ag. The first and second electrode layers 5, 5', 6, 6' are electrically connected by first and second vias 7, 7', 8, 8'. The vias 7, 7', 8, 8' are through-contacts, in particular metal vias. By way of example, the vias 7, 7', 8, 8' are formed from 100% Ag.

The vias 7, 7', 8, 8' are electrically connected to first and second external contacts 9, 9', 10, 10', which are arranged on a lower side 11 of the substrate 2. By way of example, these are contact pads. The external contacts 9, 9', 10, 10' can comprise AgNiAu. Furthermore, the vias 7, 7', 8, 8' are electrically connected to first and second connector contacts 12, 12', 13, 13', which are arranged on an upper side 14 of the substrate 2.

Moreover, a glass layer 15 for protecting the varistor ceramic is arranged on the upper side 14. By way of example, the glass layer 15 has a TiO$_2$ filler material. The connector contacts 12, 12', 13, 13' are led through the glass layer 15. Such a glass layer may also be present on the lower side 11.

Two LEDs 16, 16' are arranged on the substrate 2. The LEDs 16, 16' are electrically and mechanically connected to the connector contacts 12, 12', 13, 13', for example, by solder 17, 17'. AuSn can be used to solder the material.

By way of example, the LEDs 16, 16' are embodied for flip chip mounting. In particular, the LEDs 16, 16' each can have two contact faces on their lower sides. The LEDs 16, 16' could also each have respectively one first contact face on their lower side and one second contact face on their upper side. The second contact face can be connected to the substrate 2 by means of a wire, in particular a gold wire. The LEDs 16, 16' can be also only contacted with the substrate 2 by wires. The LEDs 16, 16' are each covered by a capping layer 18, 18'. The capping layers 18, 18' can be embodied as protection layers for protecting the LEDs 16, 16' and/or as optically active layers. By way of example, the capping layers 18, 18' are embodied as lenses and/or light-conversion layers. The capping layers 18, 18' can have different embodiments. By way of example, the first capping layer 18 is embodied such that the light produced by the first LED 16 obtains a cold-white light characteristic and the second capping layer 18' is embodied such that the light produced by the second LED 16' obtains a warm-white light characteristic. Consequently, the capping layers 18, 18' serve to shift the light spectrum. By way of example, the capping layers are each embodied as phosphor layers, in particular with a silicone matrix. By way of example, the capping layers 18, 18' have a red or yellow color.

In addition or as an alternative thereto, the capping layers 18, 18' can also have a lens function. In this case, the capping layers 18, 18' can also be embodied in colorless fashion.

By way of example, the multi-LED system 1 is used to produce a flashlight. In one embodiment, the LED system 1 has no further discrete components on the substrate 2 in addition to the LEDs 16, 16'. This facilitates a particularly good miniaturization of the LED system 1. Moreover, this can improve the light yield and the homogeneity of the emitted light. In particular, there is no shadowing or color change as a result of further surface-mounted components.

Figure 2:
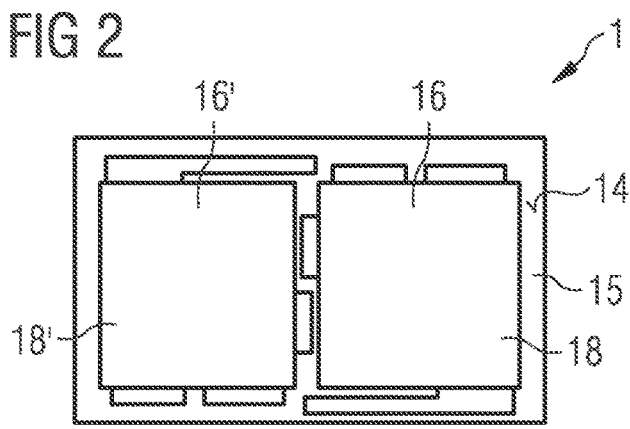
FIG. 2 shows a plan view on an upper side of an embodiment of a multi-LED system.

FIG. 2 shows a plan view on an upper side 14 of a multi-LED system 1. By way of example, the multi-LED system 1 is embodied like in FIG. 1.

The LEDs 16, 16' are each covered by capping layers 18, 18'. The capping layers 18, 18' have an approximately square form. The capping layers 18, 18' do not extend over the entire upper side 14 of the substrate 2 such that part of the glass layer 15 is exposed.

By way of example, the multi-LED system 1 has dimensions of less than or equal to 2×4 mm$^2$. By way of example, the dimensions are 1×2 mm$^2$. By way of example, the dimensions can also be 1.7×3.4 mm$^2$. As a result, the multi-LED system 1 has substantially smaller dimensions than conventional systems.

Figure 3:
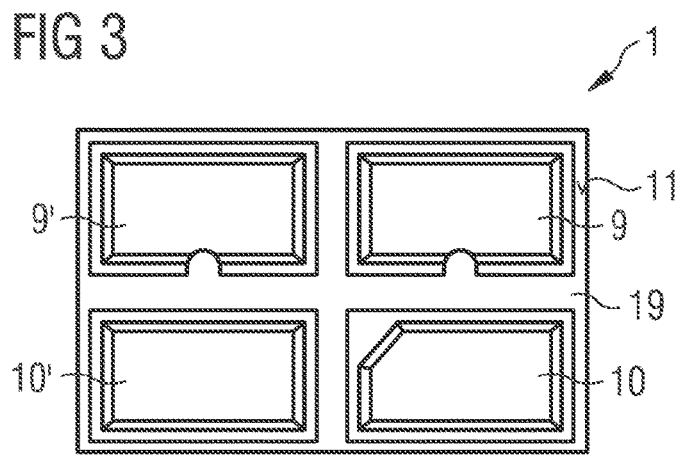
FIG. 3 shows a plan view on a lower side of an embodiment of a multi-LED system.

FIG. 3 shows a plan view on a lower side 11 of the multi-LED system 1. By way of example, this is the multi-LED system 1 from FIG. 2.

The lower side 11 of the substrate 2 is covered by a glass layer 19. The glass layer 19 can be embodied like the glass layer 15 arranged at the upper side 14 (see FIG. 2).

The multi-LED system 1 has four external contacts 9, 9', 10, 10'. By way of example, the external contacts 9, 10 are embodied to connect the first LED 16 and, unlike what is illustrated in FIG. 1, they are arranged in succession. The external contacts 9', 10' are embodied to connect the second LED 16' and are likewise arranged in succession. Consequently, the external contacts 9, 9', 10, 10' are arranged in the form of a plurality of rows and columns. This facilitates a good electric contact with low spatial requirements. Furthermore, the first external contacts 9, 9' each have a polarity mark 20, 20'.

Figure 4:
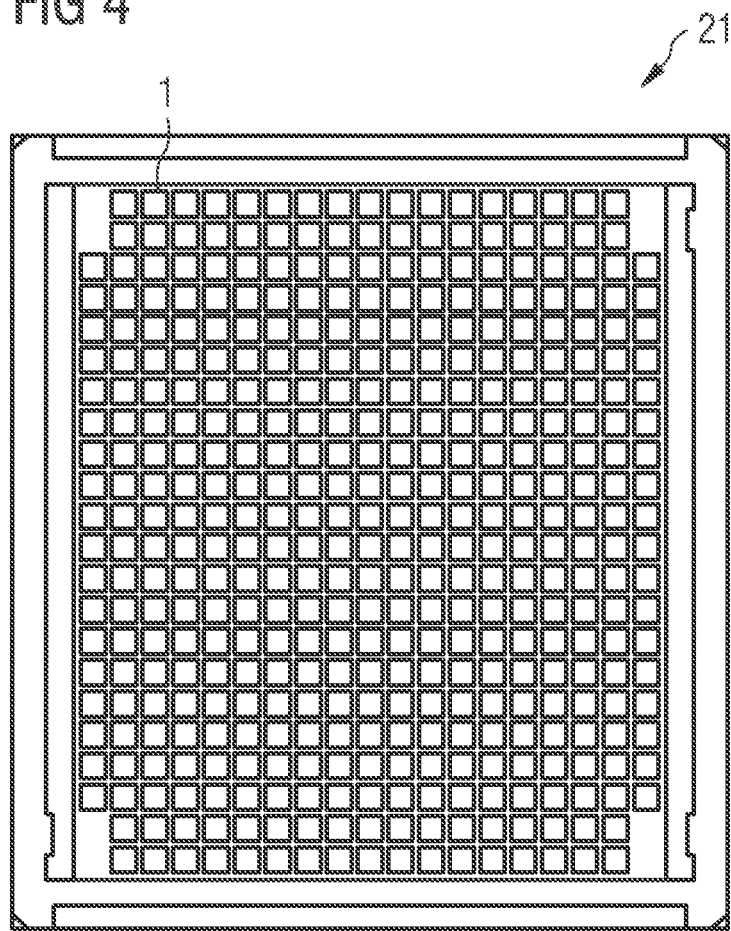
FIG. 4 shows a plan view on an upper side of a multi-substrate comprising a multiplicity of multi-LED systems.

FIG. 4 shows a plan view on an upper side of a multi-substrate 21 comprising a multiplicity of multi-LED systems 1. After dicing, the multi-LED systems 1 are each embodied as described in FIGS. 1 to 3, for example.

By way of example, the multi-substrate 21 has 325 multi-LED systems 1. By way of example, the multi-substrate 21 has a diameter in the range of 2 inches to 4 inches. By way of example, the multi-substrate 21 has dimensions of 54.5×54.5 mm$^2$.

Figure 5:
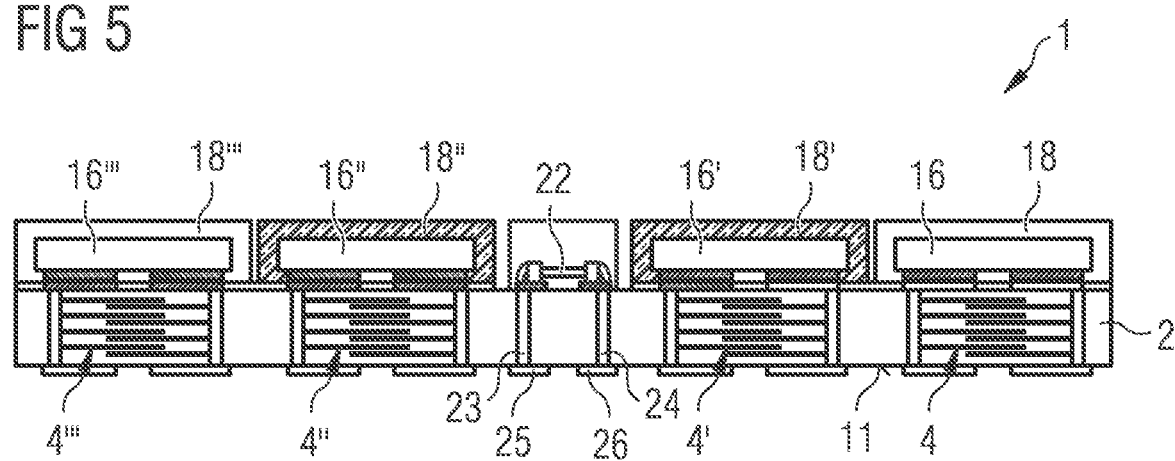
FIG. 5 shows a schematic cross section of a further embodiment of a multi-LED system.

FIG. 5 shows a sectional view of a further multi-LED system 1 according to the embodiments of the invention. In contrast to the multi-LED system 1 shown in FIG. 1, this is a four-LED system, i.e., exactly four LEDs 16, 16', 16'', 16''' are present. Furthermore, in contrast to FIG. 1, a temperature monitoring component 22 is arranged on the substrate 2. By way of example, this is an NTC or PTC thermistor. The temperature monitoring component 22 is electrically connected to connector contacts 25, 26 on the lower side 11 of the substrate 2 by means of vias 23, 24.

An ESD protection structure 4, 4', 4'', 4''' that is integrated in the substrate 2 is provided for each LED 16, 16', 16'', 16'''. Each LED 16, 16', 16'', 16''' is covered by a capping layer 18, 18', 18'', 18'''. The capping layers 18, 18', 18'', 18''' can all have different embodiments. By way of example, two capping layers 18, 18' and 18'', 18''', respectively, may also have the same properties in each case. By way of example, the two centrally arranged capping layers 18', 18'' have the same properties and the two capping layers 18, 18''' arranged on the outside have the same properties.

As imaged, the LEDs 16, 16', 16'', 16''' can be arranged next to one another. Alternatively, the LEDs 16, 16', 16'', 16''' can also be arranged at the corners of a rectangle such that two LEDs are arranged next to one another in each case and two LEDs are arranged behind one another in each case. Consequently, the LEDs are arranged in a plurality of rows and columns. Accordingly, the connector contacts can be arranged similarly to what is shown in FIG. 3.

FIG. 6 shows the flowchart of a method for producing a multi-LED system. By way of example, the multi-LED system obtained is embodied as described in FIGS. 1 to 5. During the production, the multi-substrate described in FIG. 4 is obtained first, for example, and it is subsequently diced.

According to the method, the following steps are carried out in succession: cutting the green sheets to size (step A; "tape cutting"), printing the sheets with a metal paste in order to form the electrode layers (step B; "sheet printing"), laminating the printed sheets (step C; "sheet laminating"), drilling holes through the sheet stack for the vias by means of a laser (step D; "via drilling with laser"), filling the holes with a metal paste (step E; "via filling"), isostatic pressing (step F; "isostatic pressing"), cutting the stack to size (step G; "stack cutting"), sintering the stack (step H; "sintering"), producing external contacts and connector contacts by printing the upper and lower sides of the substrate (step I1; "metal screen printing top & bottom"), firing (step J1; "firing"), printing a glass paste on the upper and lower side (step K1; "glass screen printing top & bottom"), plating (step L1; "plating"), mounting the LEDs (step M1; "LED mounting"), soldering the LEDs with AuSn soldering material (step N1; "AuSn reflow soldering"), applying the capping layers acting as a lens (step O; "lens attach+curing") and dicing (step P; "dicing").

FIG. 7 shows the flowchart of a further method for producing a multi-LED system. The method steps listed on the left-hand side in the flowchart up to the sintering of the substrate (step H) correspond to the method steps described in FIG. 6.

Subsequently, the following method steps are carried out for applying the contacts and discrete components: applying and structuring a photoresist (step I2; "photoresist structuring"), baking the photoresist (step J2; "baking"), sputtering on a metal layer (step K2; "sputtering"), chemical ablation (step L2; "chemical lift-off"), applying the LEDs and the temperature monitoring component (step M2; "LED and NTC mounting"), eutectic bonding with AuSn (step N2; "AuSn eutectic bonding"), applying the capping layers acting as a lens (step O; "lens attach+curing") and dicing (step P; "dicing").

The description of the subject matter described here is not restricted to the individual special embodiments. Rather, the features of the individual embodiments can be combined with one another, provided this is technically advantageous.

The invention claimed is:

1. A multi-LED system comprising:
a ceramic multilayer substrate in which at least two ESD protection structures are integrated;
at least two light-emitting diodes arranged on the substrate;
at least two capping layers covering one of the light-emitting diodes;
first external contacts and second external contacts arranged on a lower side of the substrate; and
first connection contacts and second connection contacts located on an upper side of the substrate,
wherein each of the light-emitting diodes is located on and is electrically connected to one of the first connection contacts and one of the second connection contacts,
wherein each ESD protection structure has ceramic layers and first and second electrode layers arranged therebetween,
wherein the first electrode layers are electrically connected via first vias, and the second electrode layers are electrically connected via second vias, and
wherein the first vias electrically connect the first connection contacts with the first external contacts and the second vias electrically connect the second connection contacts with the second external contacts.

2. The multi-LED system according to claim 1, wherein the capping layers are embodied as light-conversion layers.

3. The multi-LED system according to claim 2, wherein a first capping layer is embodied to produce warm-white light and a second capping layer is embodied to produce cold-white light.

4. The multi-LED system according to claim 1, wherein the ESD protection structures comprise a varistor ceramic.

5. The multi-LED system according to claim 1, wherein no further electrical components are arranged on the substrate in addition to the light-emitting diodes.

6. The multi-LED system according to claim 1, further comprising a temperature monitoring component arranged on the substrate.

7. The multi-LED system according to claim 6, wherein the temperature monitoring component is arranged between the light-emitting diodes.

8. The multi-LED system according to claim 1, wherein the multi-LED system comprises exactly two light-emitting diodes.

9. The multi-LED system according to claim 1, wherein the multi-LED system comprises exactly four light-emitting diodes.

10. The multi-LED system according to claim 1, wherein all external contacts are arranged in a row.

11. The multi-LED system according to claim 1, wherein the external contacts are arranged in a plurality of rows and columns.

12. The multi-LED system according to claim 1, wherein a glass layer is located at the upper side of the substrate, and wherein the connection contacts lead through the glass layer.

* * * * *